United States Patent
Child (10) Patent No.: US 8,513,109 B2
(45) Date of Patent: Aug. 20, 2013

(54) METHOD OF MANUFACTURING AN INTERCONNECT STRUCTURE FOR A SEMICONDUCTOR DEVICE

(75) Inventor: Craig Child, Hopewell Junction, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 235 days.

(21) Appl. No.: 13/052,956

(22) Filed: Mar. 21, 2011

(65) Prior Publication Data

US 2011/0171822 A1    Jul. 14, 2011

Related U.S. Application Data

(62) Division of application No. 12/413,164, filed on Mar. 27, 2009, now Pat. No. 7,932,613.

(51) Int. Cl.
  *H01L 23/485*    (2006.01)
  *H01L 23/498*    (2006.01)

(52) U.S. Cl.
  USPC ........... 438/614; 257/697; 257/738; 257/779; 257/E23.021; 257/E23.068

(58) Field of Classification Search
  USPC ................. 257/692, 693, 697, 737, 738, 772, 257/778, 779, 781, E21.585, E23.01, E23.021, 257/E23.068, E23.069; 438/613, 614; 439/82
  See application file for complete search history.

(56) References Cited

U.S. PATENT DOCUMENTS

| | | | |
|---|---|---|---|
| 4,400,865 A * | 8/1983 | Goth et al. | ............ 438/303 |
| 5,773,889 A | 6/1998 | Love et al. | |
| 5,980,270 A | 11/1999 | Fjelstad et al. | |
| 6,437,451 B2 | 8/2002 | Farnworth et al. | |
| 6,727,579 B1 | 4/2004 | Eldridge et al. | |
| 2004/0197955 A1 | 10/2004 | Lee | |
| 2005/0146030 A1 | 7/2005 | Miyazaki | |
| 2006/0055035 A1 | 3/2006 | Lin et al. | |
| 2008/0032457 A1 | 2/2008 | McWilliams et al. | |
| 2008/0108221 A1 | 5/2008 | Kim et al. | |
| 2008/0197489 A1 * | 8/2008 | Chyi | ............ 257/737 |
| 2008/0211093 A1 | 9/2008 | Ke et al. | |
| 2010/0032832 A1 | 2/2010 | Tomura et al. | |

FOREIGN PATENT DOCUMENTS

| | | |
|---|---|---|
| EP | 1 189 270 A2 | 3/2002 |
| JP | 05275489 A | 10/1993 |
| JP | 10012621 A | 1/1998 |
| JP | 2000299338 A | 10/2000 |
| JP | 2006278417 A | 10/2009 |
| WO | 2008142839 A1 | 11/2008 |

OTHER PUBLICATIONS

PCT International Search Report for PCT/US2010/027591 mailed Aug. 26, 2010.
German Office Action prepared Jan. 25, 2013 for related German Patent Application No. 11 2010 001 383.7.

* cited by examiner

*Primary Examiner* — Julio L Maldonado
*Assistant Examiner* — Daniel Shook
(74) *Attorney, Agent, or Firm* — Ingrassia Fisher & Lorenz, P.C.

(57) ABSTRACT

A method of manufacturing an interconnect structure for a semiconductor device having a device substrate is provided. The semiconductor device includes an electrically-conductive pad formed overlying the device substrate and an electrically-conductive platform formed overlying the electrically-conductive pad and enclosing a cavity. The electrically-conductive platform has a perimeter portion extending away from the electrically-conductive pad and a capping portion atop the perimeter portion. The semiconductor device also includes a cushioning material disposed in the cavity.

16 Claims, 7 Drawing Sheets

METHOD OF MANUFACTURING AN INTERCONNECT STRUCTURE FOR A SEMICONDUCTOR DEVICE

CROSS REFERENCE TO RELATED APPLICATION

This application is a divisional of U.S. patent application Ser. No. 12/413,164, filed Mar. 27, 2009.

TECHNICAL FIELD

Embodiments of the subject matter described herein relate generally to interconnect structures suitable for use with semiconductor devices. More particularly, embodiments of the subject matter relate to resilient stress absorbers for semiconductor device interconnect structures.

BACKGROUND

The prior art includes a variety of techniques and interconnect structures for connecting semiconductor chips to circuit boards, other devices, substrates, etc. For example, solder beads are often used to connect flip chips to external circuitry. Such solder beads are typically disposed in a conductive recess or terminal of the flip chip and reflowed to form a bead for connecting to external devices, such as a circuit board. Such solder beads are typically formed from lead or lead alloy. Recently, silver has been used to replace lead to lessen any impact of discarded chips on the environment.

Another process for forming solder connections is the creation of a pillar interconnect with a solder bead formed atop the pillar interconnect. The pillar interconnect is typically disposed over a contact pad of the semiconductor device and extends upward. An array of such pillar interconnects can be fabricated with a very small pitch to accommodate high density applications. The solder beads of the array can then be coupled to the external circuitry using reflow techniques.

When using pillar interconnects, any force imparted by the external circuitry is transmitted to the pillar interconnects. In turn, the pillar interconnects transmit the force to the semiconductor device at the coupling site between the pillar interconnect and the device. As compared to solder beads disposed directly in the chip (using conventional techniques), the pillar interconnects have a narrower base, resulting in a greater stress being imparted on the semiconductor device. The resulting strain can manifest itself in myriad undesirable ways, such as cracking or delamination of certain materials.

BRIEF SUMMARY

A semiconductor device having a device substrate is provided. The semiconductor device comprises an electrically-conductive pad formed overlying the device substrate, an electrically-conductive platform formed overlying the electrically-conductive pad and enclosing a cavity, the electrically-conductive platform having a perimeter portion extending away from the electrically-conductive pad and a capping portion atop the perimeter portion, and a cushioning material disposed in the cavity.

A semiconductor device structure having a device substrate is provided also. The semiconductor device structure comprises an electrically-conductive contact pad formed overlying the device substrate, a resilient block disposed on the contact pad, the resilient block adapted to elastically deform in response to a force, an electrically-conductive platform substantially surrounding the resilient block, the platform coupled to the resilient block and electrically coupled to the contact pad, an electrically-conductive pillar interconnect disposed above, and electrically coupled to, the platform, the pillar interconnect extending to a termination end, and a solder bead formed on the termination end.

A method of forming a contact platform for a device substrate is also provided. The method comprises providing a semiconductor device structure having an electrically-conductive contact element, a passivation layer atop the electrically-conductive contact element, and a recess extending through the passivation layer and terminating at the electrically-conductive contact element, at least partially filling the recess with a resilient material, resulting in a filled recess, selectively removing a portion of the resilient material from the filled recess to form a resilient pad positioned in the recess, the resilient pad overlying the electrically-conductive contact element and spaced apart from the passivation layer, and forming an electrically-conductive platform in the recess such that the electrically-conductive platform at least partially surrounds the resilient pad.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Figure 1:
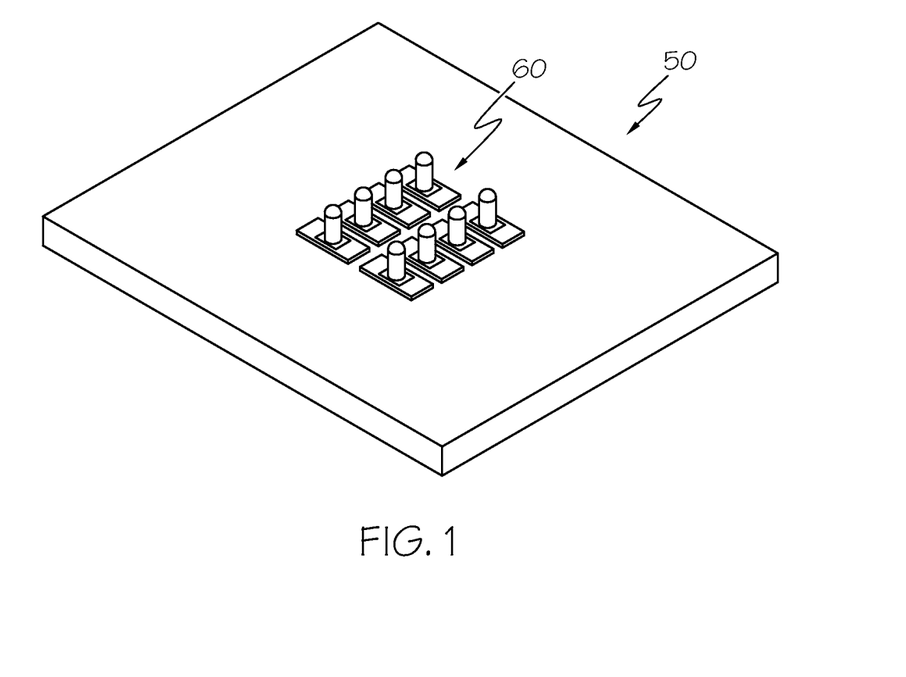
FIG. 1 is a perspective view of an embodiment of a semiconductor device having a group of stress-absorbing interconnect structures.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and does not necessarily connect a direct mechanical connection. Coupled elements/nodes/features are understood to exert mutual influence on one another. Thus, although the schematic shown in FIG. 1 depicts one exemplary arrangement of elements, additional intervening elements, devices, features, or components may be present in an embodiment of the depicted subject matter.

"Adjust"—Some elements, components, and/or features are described as being adjustable or adjusted. As used herein, unless expressly stated otherwise, "adjust" means to position, modify, alter, or dispose an element or component or portion thereof as suitable to the circumstance and embodiment. In certain cases, the element or component, or portion thereof, can remain in an unchanged position, state, and/or condition as a result of adjustment, if appropriate or desirable for the embodiment under the circumstances. In some cases, the element or component can be altered, changed, or modified to a new position, state, and/or condition as a result of adjustment, if appropriate or desired.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made in a consistent but arbitrary frame of reference. Such terminology may include the words specifically mentioned above, derivatives thereof, and words of similar import. Similarly, the terms "first", "second", and other such numerical terms referring to structures do not imply a sequence or order unless clearly indicated by the context.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate interconnects for any number of semiconductor-based devices, e.g., transistor devices, diodes, switches, transmission lines, etc. Additionally, the subject matter relates to controlled collapse chip connections, which are often utilized with flip chips, and are included in descriptions of the semiconductor device structures presented below.

For semiconductor devices employing pillar interconnect techniques, a resilient stress absorber, similar to a cushion or resilient pad, can be positioned below the pillar interconnect to reduce the stress transmitted to the surrounding regions of the semiconductor device. Preferably, the resilient stress absorber comprises at least one electrically-conductive portion, thereby permitting electrical connectivity between the semiconductor device and the pillar interconnect. In a preferred embodiment, a resilient portion is incorporated into the interconnect structure; the resilient portion can undergo elastic deformation when subjected to stress. Consequently, forces and stresses received by the pillar interconnect are absorbed prior to transmission to the semiconductor device.

FIG. 1 is a perspective view of a semiconductor device 50 having a plurality of interconnect structures 60. The interconnect structures 60 can be used to couple the semiconductor device 50 to other components or external circuitry. The interconnect structures 60 can provide coupling points which not only mechanically couple the components together, but which also provide channels of electrical conductivity through which features of the semiconductor device 50 can be operated by an external circuit board, for example. Other devices can also be coupled to the semiconductor device 50, as well.

Although a certain number of interconnect structures 60 are shown for illustrative purposes, the exact number can vary between embodiments. Additionally, a skilled practitioner in the art will recognize that additional interconnect structures 60 can be present in various embodiments of the semiconductor device 50. Moreover, different concentrations, arrangements, groupings, and shapes can be used for the interconnect structures 60, as appropriate to the embodiments.

Figure 2:
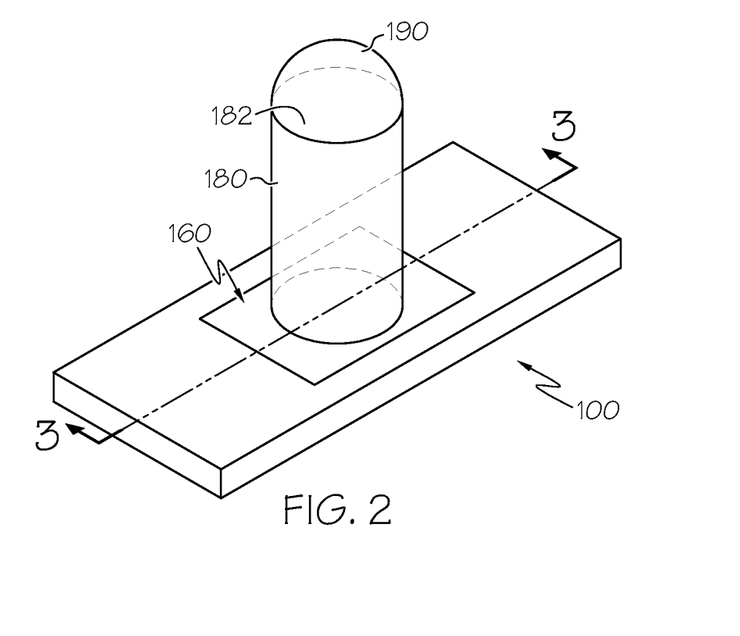
FIG. 2 is a perspective view of an interconnect structure having a resilient stress absorber.

FIG. 2 illustrates a detailed view of one interconnect structure 100. The interconnect structure 100 comprises, among other elements, an electrically-conductive pillar interconnect 180 and a solder bead 190 atop the pillar interconnect 180. The pillar interconnect 180 is preferably coupled to the interconnect structure 100 at an electrically-conductive platform 160. Other layers, features, and/or components can be present, surrounding the pillar interconnect 180 and/or solder bead 190, but are omitted for clarity. Additionally, as previously described, additional interconnect structures can be present on a single semiconductor device.

Figure 3:
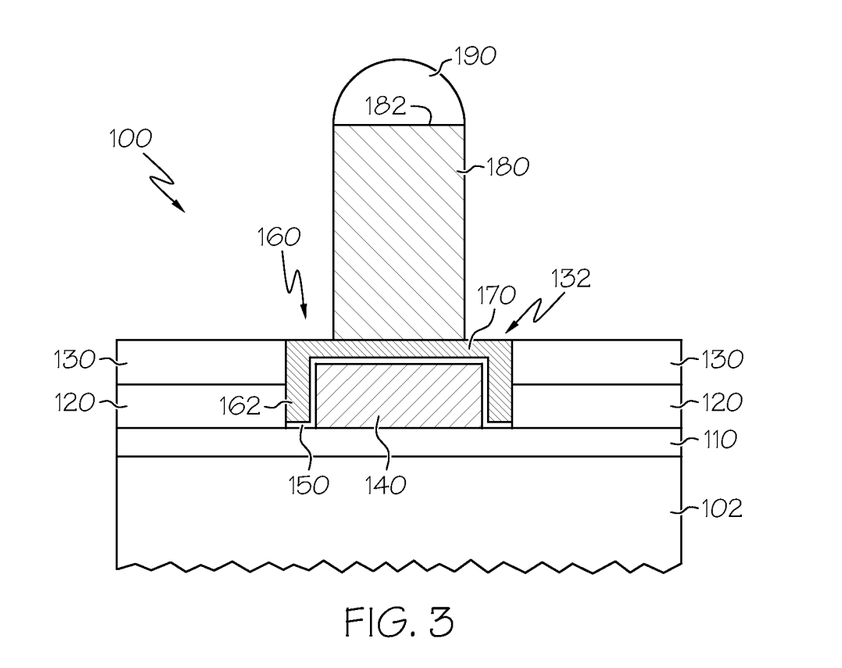
FIG. 3 is a cross-sectional view of the interconnect structure of FIG. 2.

FIG. 3 illustrates a cross-sectional view of the interconnect structure 100 taken across the line 3-3 in FIG. 2. The interconnect structure 100 preferably includes, without limitation: a device substrate 102, an electrically-conductive contact element or contact pad 110, a first layer of insulating material, e.g., a nitride layer 120, a second layer of insulating material, e.g., an oxide layer 130, a resilient block 140, an adhesion layer 150, the electrically-conductive platform 160, the pillar interconnect 180, and the solder bead 190. The electrically-conductive platform 160 can comprise a perimeter portion 162 and a capping portion 170.

As used herein, the device substrate 102 represents a portion of the semiconductor device 50 that includes the functional device features, conductive traces, interconnect plugs, circuit elements, and the like. In other words, the device substrate 102 includes any operating features and elements, along with associated electrical connections and conductive traces. For example, the device substrate 102 may include any number of layers of different materials, such as layers of semiconductor material, layers of dielectric materials, conductive metal layers, etc. These different material layers can be used to form active devices (e.g., transistors), electrical contacts, interlayer connections, and other features that are commonly found in semiconductor devices. For simplicity and ease of description, the detailed features of device substrate 102 (which will vary from one device to another) are not depicted in the figures.

The device substrate 102 may include a semiconductor material, which can be processed using well known techniques and process steps (e.g., techniques and steps related to doping, photolithography and patterning, etching, material growth, material deposition, surface planarization, and the like), which will not be described in detail here. The device substrate 102 can be realized using a silicon-on-insulator (SOI) substrate, where semiconductor material is disposed on a layer of insulator material that, in turn, is supported by a carrier wafer (not shown). In alternate embodiments, the device substrate 102 can be realized using a bulk silicon substrate rather than an SOI substrate.

Although any suitable semiconductor material may be employed, for this embodiment the semiconductor material in device substrate 102 comprises a silicon material, where the term "silicon material" is used herein to encompass the generally monocrystalline and relatively pure silicon materials typically used in the semiconductor industry, as well as silicon admixed with other elements such as germanium, carbon, and the like. Additionally, the device substrate 102 can comprise germanium, gallium arsenide, or the like.

An electrically-conductive pad 110 can be formed overlying the device substrate 102. In practice, the electrically-conductive pad 110 corresponds to one electrical node, port, or connection point of the interconnect structure 100, and the electrically-conductive pad 110 represents an electrical interface for the interconnect structure 100. For instance, the electrically-conductive pad 110 can be a contact region for the source, gate, or drain of a transistor device formed on the device substrate 102. The electrically-conductive pad 110 can be formed using any desired technique and/or process. Preferably, the electrically-conductive pad 110 comprises a conductive metal material, such as pure copper or a copper alloy. Other electrically-conductive materials can be used as desired for the embodiment, however, including aluminum and aluminum alloys, silver and silver alloys, and so on. Although illustrated extending a certain length along the device substrate 102, the exact dimensions of the electrically-conductive pad 110 can vary between embodiments. Moreover, more than one pillar interconnect 180 may be coupled to a single electrically-conductive pad 110.

The nitride layer 120 and the oxide layer 130 are located above the electrically-conductive pad 110, and surround the perimeter portion 162. The nitride layer 120 can be formed from any appropriate nitride compound, including silicon nitrides. As explained in more detail below, the nitride layer 120 defines at least a portion of a recess such as the recess 132 containing the electrically-conductive platform 160. The nitride layer 120 can extend along the electrically-conductive pad 110 as far as desired to work properly with other features of the interconnect structure 100. The nitride layer 120 can be approximately 4000-5000 Angstroms thick. In certain embodiments, it can be thinner, or thicker, as desired.

The oxide layer 130 at least partially overlies the nitride layer 120, and is shaped to conform to the shape of the nitride layer 120. Thus, the oxide layer 130 preferably defines at least a portion of the same recess 132 as the nitride layer 120. The oxide layer 130 can be formed from any appropriate material, such as a silicon oxide, or a low-k material. The oxide layer 130 can be approximately 4000-5000 Angstroms thick, although in certain embodiments, it can be thinner, or thicker, as desired or appropriate for the embodiment.

The nitride 120 and oxide layers 130 can serve as electrical insulators. Additionally, although two passivation layers are illustrated, more or fewer can be present in different embodiments of the interconnect structure 100 as selected for the embodiment. Thus, certain embodiments can have a single passivation layer, while others can have two or more.

The resilient portion or resilient block 140 can be formed overlying the electrically-conductive pad 110. The resilient block 140 is located in a cavity beneath the electrically-conductive platform 160, as shown. In certain embodiments, the resilient block 140 is formed directly on and adjacent to the electrically-conductive pad 110. Preferably, the resilient block 140 is composed of a material having linear elastic stress/strain mechanical properties. Thus, the resilient block 140 is suitably designed and configured to maintain its undeformed shape (e.g., a rectangular block) in an unloaded state. However, when a force is imparted to the 140, it can undergo elastic deformation in response to the force, and returns to its undeformed shape when the force is removed. Accordingly, the resilient block 140 can absorb stresses through elastic deformation, much like a spring or cushion. Accordingly, the resilient block 140 can be referred to as a cushioning block, cushioning material, stress-absorbing component, and so on.

The resilient block 140 is therefore preferably formed from materials exhibiting such mechanical properties, as well as ease of formation. One such type of material is a polyimide, and preferably, for easy of manufacture, is a photo-sensitive polyimide. Moreover, the resilient block 140 can, if desired, be realized as a composite structure having a plurality of different layers, segments, or areas formed from different materials. The resilient block 140 is depicted as a rectangular prism, though not to any particular scale or proportion. Accordingly, other sizes and scales can be used as desired. Preferably, the resilient block 140 has a substantially quadrilateral shape.

The resilient block 140 can have a thickness (i.e., height, as measured extending above the electrically-conductive pad 110). Preferably, the maximum height of the resilient block 140 is less than the combined thicknesses of the nitride 120 and oxide 130 layers and by a suitable clearance that a desired thickness of the capping portion 170 can be formed. Thus, the resilient block 140 preferably has a height less than the combined height of the surrounding nitride 120 and oxide 130 layers. In certain embodiments, the resilient block 140 has a thickness within the range of about 600 to 1000 Angstroms. Additionally, the resilient block 140 is preferably spaced apart from the nitride 120 and oxide 130 layers. In certain embodiments, this space can be within the range of about 400 to 800 nanometers.

An adhesion layer 150 can be used to facilitate adhesion of the electrically-conductive platform 160 to the resilient block 140 and to the electrically-conductive pad 110, as described in more detail below. Accordingly, the adhesion layer 150 is located between the electrically-conductive platform 160 and the resilient block 140, and between the electrically-conductive platform 160 and the electrically-conductive pad 110. As shown in FIG. 3, the adhesion layer 150 is preferably formed in the recess in the nitride 120 and oxide 130 layers, and it covers the resilient block 140 and the section of the electrically-conductive pad 110 located below the perimeter portion 162 of the electrically-conductive platform 160. Thus, the upper and side surfaces of the resilient block 140 can be covered by the adhesion layer 150.

The adhesion layer 150 can comprise chromium, or a chromium alloy, or other material that promotes adhesion between the resilient block 140 and the material used for the electrically-conductive pad 110 (e.g., copper and/or copper alloys), as well as permitting electrical conductivity therethrough. The adhesion layer 150 can be formed by a sputtering process, depositing it on the interconnect structure 100. The adhesion layer 150 can have a substantially uniform thickness, such as between 20 and 40 Angstroms, although the thickness can vary between embodiments.

The electrically-conductive platform 160 is preferably formed over the electrically-conductive pad 110 and resilient block 140. The electrically-conductive platform 160 comprises a perimeter portion 162 and a capping portion 170. The perimeter portion 162 preferably surrounds the resilient block 140 up to the height of the resilient block 140. The capping portion 170 preferably overlays the perimeter portion 162 and resilient block 140, enclosing the cavity in which the resilient block 140 is positioned. As shown in FIG. 3, the recess 132 corresponds to the space defined by the capping portion 170, the perimeter portion 162, and the electrically-conductive pad 110. In certain embodiments, the perimeter portion 162 can be considered extending up to the maximum height of the electrically-conductive platform 160, while the capping portion 170 is only the portion directly atop the resilient block 140. In different embodiments, the portions of the electrically-conductive platform 160 are therefore referred to differently, but still perform the same functions and have substantially the same features. The electrically-conductive pad 110 is electrically coupled to the electrically-conductive platform 160, including conduction through the adhesion layer.

The perimeter portion 162 is preferably formed in the space between the resilient block 140 and the nitride 120 and oxide 130 layers. The perimeter portion 162 can be formed atop the adhesion layer 150, as shown. In other embodiments in which the adhesion layer 150 has been removed from the surface of the electrically-conductive pad 110, the perimeter portion 162 can be formed directly on the surface of the electrically-conductive pad 110. The adhesion layer 150 can still form a surface between the side walls of the resilient block 140 and the perimeter portion 162. The perimeter portion 162 preferably extends upward to couple with the capping portion 170.

The capping portion 170 can be formed atop the resilient block 140 and, as described above, in some embodiments, atop the perimeter portion 162 as well. The capping portion 170 is preferably a substantially planar member adapted to cover the resilient block 140, extending substantially parallel to the electrically-conductive pad 110. The thickness of the capping portion 170 can vary between embodiments. The combination of perimeter portion 162 and capping portion 170 preferably have a height above the electrically-conductive pad 110 substantially equal to the height of the nitride 120 and oxide 130 layers. Thus, the combination of the resilient block 140, adhesion layer 150, and electrically-conductive platform 160 preferably fills the recess shown in the nitride 120 and oxide 130 layers.

The capping portion 170 has an outer perimeter and an inner perimeter. The outer perimeter or outer boundary is the maximum extent of the capping portion 170. The capping portion 170 is supported by the perimeter portion 162 as it extends across the resilient block 140. Accordingly, the inner perimeter is the boundary described by the outer edge of the resilient block 140, and within the inner boundary or inner perimeter, the capping portion 170 is supported by the resilient block 140, through the adhesion layer 150.

The perimeter portion 162 and capping portion 170 are preferably composed of a highly-conductive metal material, such as copper, aluminum, silver, gold, or alloys thereof. The perimeter portion 162 and capping portion 170 can be integrally formed as one continuous, or integral, element, or they can be fabricated as two distinct elements that are attached or otherwise coupled together.

The pillar interconnect 180 can be formed atop the electrically-conductive platform 160. The pillar interconnect 180 preferably has a substantially cylindrical shape, as shown. The pillar interconnect 180 can be formed directly on the capping portion 170, or with one or more additional conductive layers formed therebetween. Preferably, the pillar interconnect 180 is composed of a highly-conductive metal material, such as copper, aluminum, or alloys thereof In practice, the pillar interconnect 180, the electrically-conductive platform 160, and the electrically-conductive pad 110 all can be formed from the same material.

Figure 4:
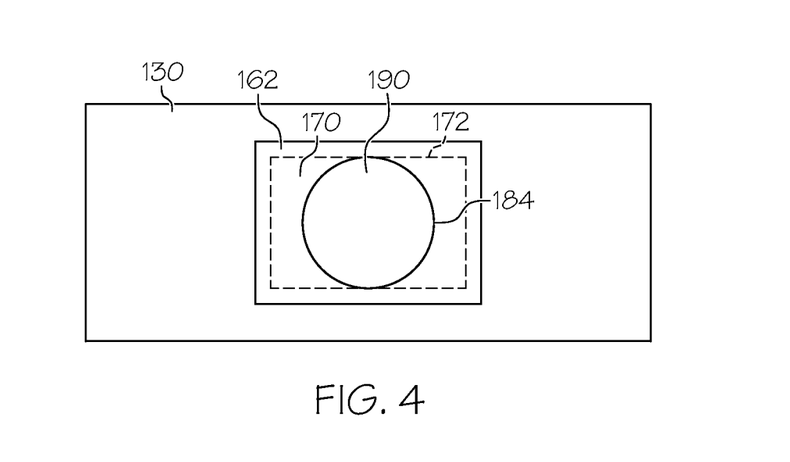
FIG. 4 is a top view of the interconnect structure of FIG. 2.

With additional reference to FIG. 4, a top view of the pillar interconnect 180 and capping portion 170 can be seen, with the inner perimeter 172 of the capping portion 170 shown in dashed lines. The pillar interconnect 180 can be seen to have an outer diameter, outer perimeter 184, or outer boundary at its base where it couples to the electrically-conductive platform 160. The outer perimeter 184 of the pillar interconnect 180 can be thought of as a footprint describing the contact area between the pillar interconnect 180 and the capping portion 170. Preferably, the outer perimeter 184 of the pillar interconnect 180 is defined or bounded entirely within the inner perimeter 172 of the capping portion 170. Thus, the pillar interconnect 180 preferably couples to the capping portion 170 in an area entirely over the resilient block 140. Accordingly, in a preferred embodiment, no part of the contact surface of the pillar interconnect 180 is disposed overlying the perimeter portion 162. Other embodiments can have other configurations.

The pillar interconnect 180 can be surrounded by other material, such as other passivation or electrically-conductive layers and/or pads, as necessary for the device or circuit being implemented. The pillar interconnect 180 can have a termination end 182 at its top, relative to the electrically-conductive pad 110. The termination end 182 can be smooth or textured as appropriate for the employed attachment technique. A solder bead 190 can be formed on the termination end 182 or top of the pillar interconnect 180. The solder bead 190 can be composed of lead, silver, tin, or any other desired material.

Stresses from the connection between the interconnect structure 100 and external circuitry or stresses from thermal expansion differentials can be received at the solder bead 190 and transmitted through the pillar interconnect 180. The stresses or forces transmitted through the pillar interconnect 180 are in turn received by, imposed on, or experienced by the electrically-conductive platform 160. Because the electrically-conductive platform 160 is coupled to the resilient block 140, certain stresses, such as torsional and compressive stresses, can be transmitted to the resilient block 140. The resilient block 140 can elastically deform in response to the received stresses, thereby absorbing them and inhibiting transmission throughout the interconnect structure 100. Accordingly, the stresses received from external components, as well as thermal expansion, can be isolated from other features, protecting them.

FIGS. 5-15 are cross sectional views that illustrate the formation of an exemplary interconnect structure for a semiconductor device. The interconnect structure 100 described above may be fabricated in accordance with the process described below. It should be appreciated that formation of different embodiments can include any number of additional or alternative steps, which will not be exhaustively described here. Additionally, the numbers used to indicate certain features in FIGS. 5-15 are the same as used above, except that, where applicable, they have been incremented by 300. Additional features and/or variations can also be present, as described below.

Figure 5:
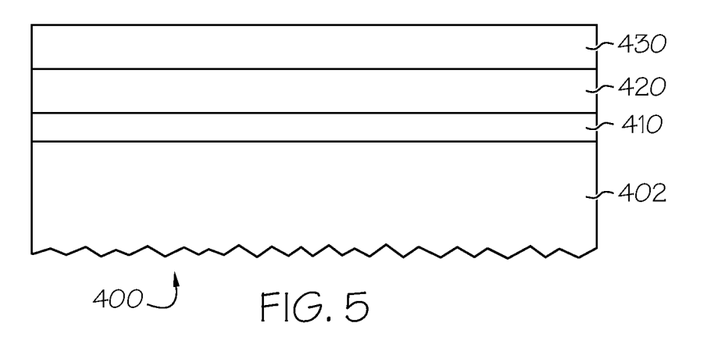
FIGS. 5-14 are cross sectional views that illustrate the formation of an exemplary interconnect structure that includes a resilient stress absorber.

FIG. 5 depicts the semiconductor device in a state following front end processing and prior to formation of interconnect structures. FIG. 5 depicts an intermediate state in the overall fabrication process after formation of a device substrate 402, an electrically-conductive pad 410, a nitride layer 420, and an oxide layer 430. The illustrated device substrate 402 can include any number of layers of different materials, such as layers of semiconductor material, layers of dielectric materials, conductive metal layers, etc., and incorporate features such as active devices (e.g., transistors), electrical contacts, interlayer connections, and other features that are commonly found in semiconductor devices. Additionally, although specific compounds are recited, such as oxides and nitrides, other materials, such as low-k and ultra-low-k dielectric materials can be used as well. The nitride 420 and oxide 430 layers can serve as stop indicators or stop layers for certain processes, as described below.

Figure 6:
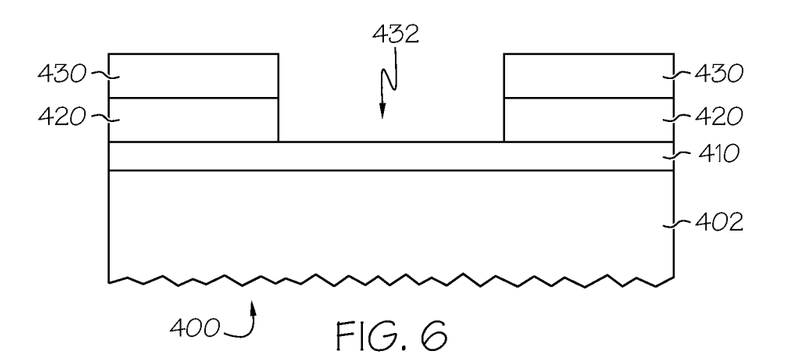

After the structure as depicted in FIG. 5 has been provided, material can be selectively removed to form a recess 432, as shown in FIG. 6. Material is selectively removed from the nitride 420 and oxide 430 layers using well-known process techiques. For example, a suitably patterned etch mask can be formed overlying the upper surface of the 430, and the etch mask can be used to selectively etch the oxide layer 430 and the nitride layer 420 to define the recess 432. Preferably, the removal of material extends down to the electrically-conductive pad 410. In practice, the device substrate 402 may require a plurality (e.g., tens, hundreds, thousands, or more) of interconnect structures. Accordingly, although only one recess 432 for one interconnect structure is depicted in FIG. 6, a practical embodiment may etch an array of recesses in the nitride layer 420 and the oxide layer 430 as needed to accommodate a plurality of interconnect structures. Thus, the process steps described herein and below for the fabrication of a resilient block and electrically-conductive platform can be carried out for any number of semiconductor device structures.

Figure 7:
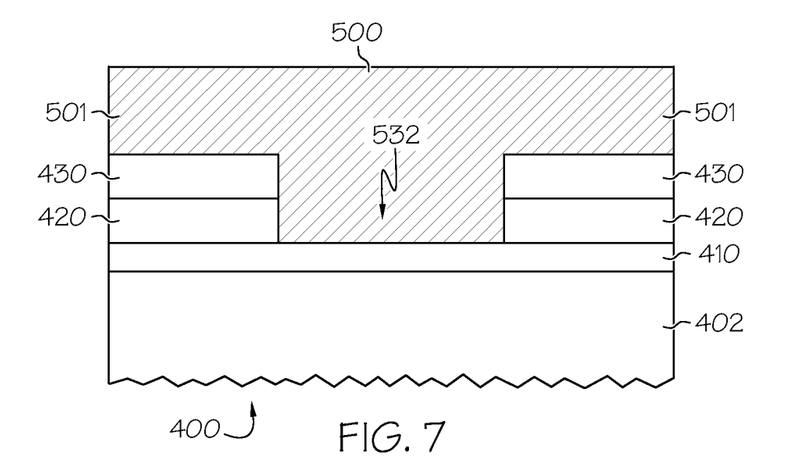

After formation of the recess 432, the recess 432 can be at least partially filled with a resilient material 500 (see FIG. 7). As mentioned above, the resilient material 500 can be a photo-sensitive polyimide, which is desirable to accommodate subsequent process steps.

In certain embodiments, the resilient material 500 is formed by a suitable deposition technique, e.g., a coating technique, such as spin coating. Preferably, the resilient material 500 is conformally deposited such that it completely fills the recess 432. Accordingly, during the deposition step, some amount of resilient material 500 can be deposited over the oxide 430 layer. FIG. 7 illustrates how this excess material 501 (referred to as "overburden") overlies the oxide layer 130. Deposition of the resilient material 500, now having at least partially filled the recess 432, results in a filled recess 532.

Figure 8:
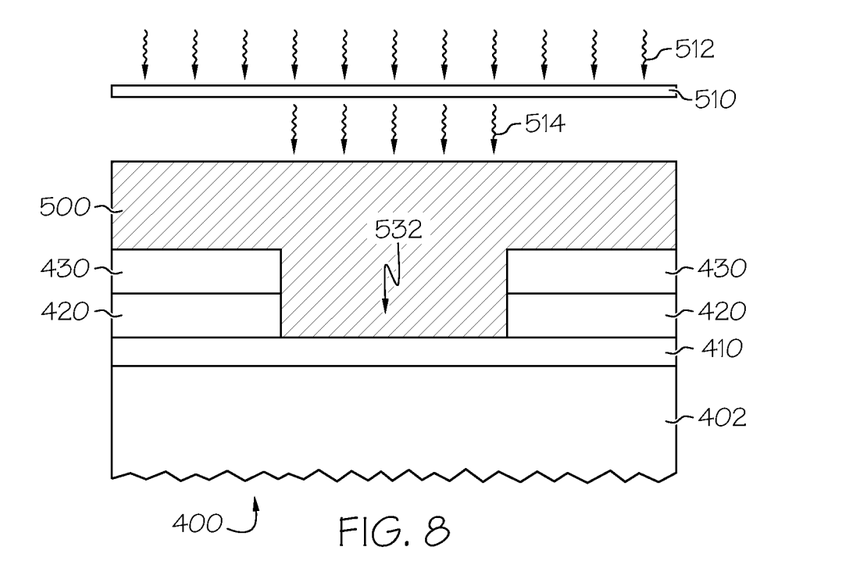

This example continues with one or more photolithography steps. In this regard, FIG. 8 illustrates a photolithographic exposing/exposure step, during which the resilient material 500 (which is a photo-sensitive material) is exposed to radiation (e.g., light) having a predefined pattern. A selective photoexposure device, such as a patterned glass layer 510 having a suitable photomask defined thereon can be disposed above the resilient material 500. Light 512 of an appropriate portion of the electromagnetic spectrum, and not necessarily visible light, can be provided, directed toward the interconnect structure through the patterned glass layer 510, as shown.

Figure 9:
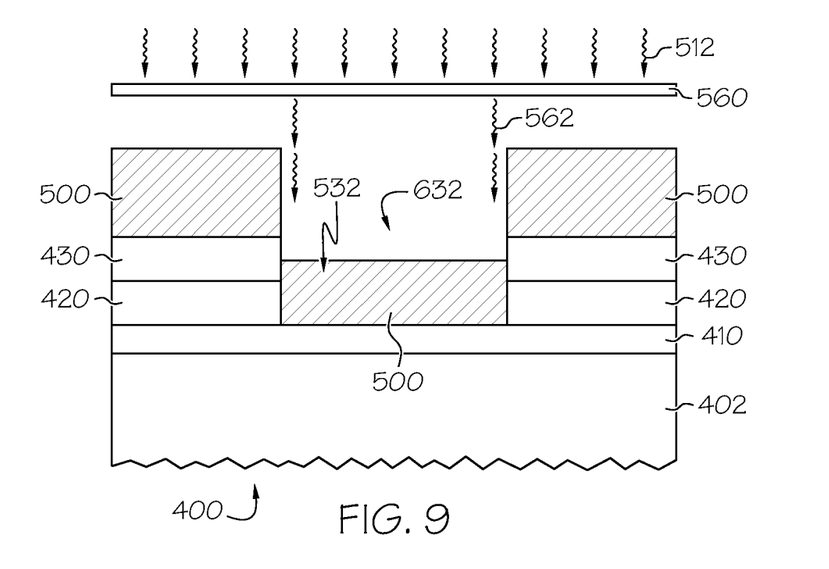

Adjusted light 514 will pass through the patterned glass layer 510 in accordance with the design of the pattern disposed thereon. The adjusted light 514 can be selectively admitted, or have altered characteristics from light 512, allowing for filtration of specific wavelengths, if desired. The adjusted light 514 can adjust the properties of the exposed photo-sensitive resilient material, as is well understood. The illustrated embodiment uses two photolithography steps to selectively remove a portion of the resilient material 500. As shown in FIG. 8, in a first step, adjusted light 514 is transmitted to the portions of the resilient material 500 in the filled recess 532. The exposed resilient material 500 is then developed using an appropriate developer chemistry to remove some of the resilient material 500 located in the filled recess 532, as shown in FIG. 9. Note that the recess 632 depicted in FIG. 9 represents the portion of the resilient material that has been removed as a result of this initial developing step.

The remaining resilient material 500 then can be subjected to a second exposure and develop procedure. As shown in FIG. 9, a second exposure through a second patterned glass layer 560 can result in adjusted light 562 provided to resilient material 500 along the perimeter of the filled recess 532. After exposing the resilient material 500 with the adjusted light 562, the exposed material is developed to form the resilient block 540 as shown in FIG. 10.

Figure 10:
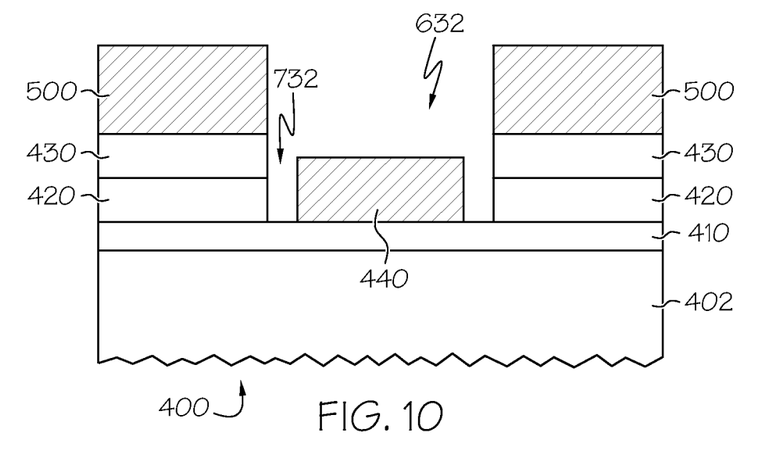

It should be understood that although the illustrated embodiment depicts removal of a broad layer of resilient material 500 in the recess 632 before the removal of the resilient material 500 along the perimeter of the recess 732, the operations could be performed in reverse order to achieve the same result shown in FIG. 10. Additionally, while a double-exposure lithographic process is depicted and described, a single lithographic process using graduated, selective irradiation and/or controlled concentrations to selectively remove resilient material 500 can also be used. Moreover, a double-exposure lithographic process can, in certain embodiments, encompass only a single developing step after both irradiation steps. The exact technique for selectively removing resilient material 500 can vary between embodiments, but preferably results in the formation of the resilient block 440 spaced apart from the nitride 120 and oxide 130 layers, as shown in FIG. 10.

Figure 11:
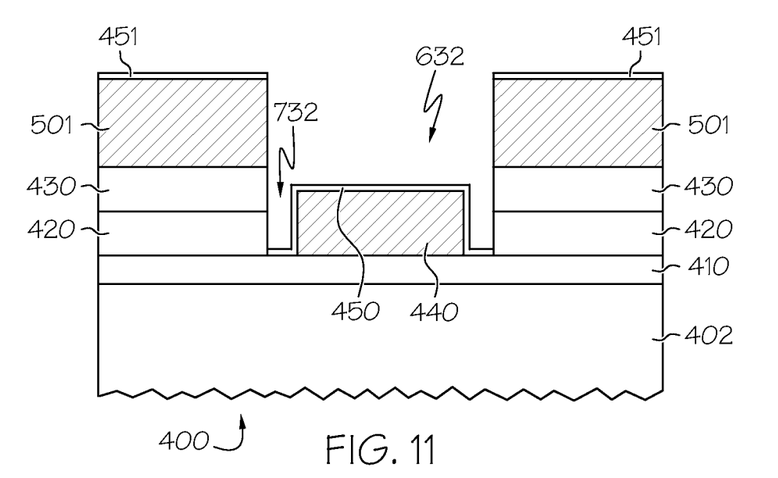

After formation of the resilient block, this example method proceeds with the addition of an adhesion layer 450 (see FIG. 11). The adhesion layer 450 can be deposited using any desired technique, including CVD or PVD, including sputtering. Preferably, the adhesion layer 450 surrounds the resilient block 440. As described above, the adhesion layer 450 can be formed atop the electrically-conductive pad 410 in the recess 732, as well. Some overburden 451 of the adhesion layer material can occur as well. The portion of the adhesion layer 450 formed along the electrically-conductive pad 410 optionally can be removed.

Figure 12:
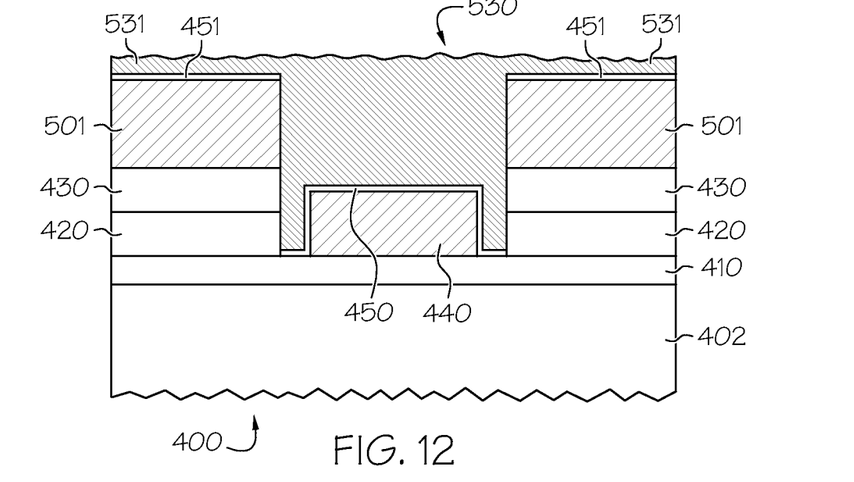

After the formation of the adhesion layer 450, an electrically-conductive material 530 can be formed over the resilient block 440, as shown in FIG. 12. The electrically-conductive material 530 is typically a metal material. In preferred embodiments, the electrically-conductive material 530 includes copper or an alloy thereof. Alternatively, the electrically-conductive material 530 can include, without limitation, aluminum or an alloy thereof.

The electrically-conductive material 530 can be formed by a suitable deposition technique, such as CVD or PVD techniques. Preferably, the resilient material 500 is conformally deposited such that it completely fills the recesses 632, 732, both surrounding and above the resilient block 440. Some overburden 531 of the electrically-conductive material 530 can be formed atop the overburden 501 of the resilient material 500 and overburden 451 of the adhesion layer 450. The adhesion layer 450 preferably promotes and facilitates coupling between the resilient block 440 and the electrically-conductive material 530.

Figure 13:
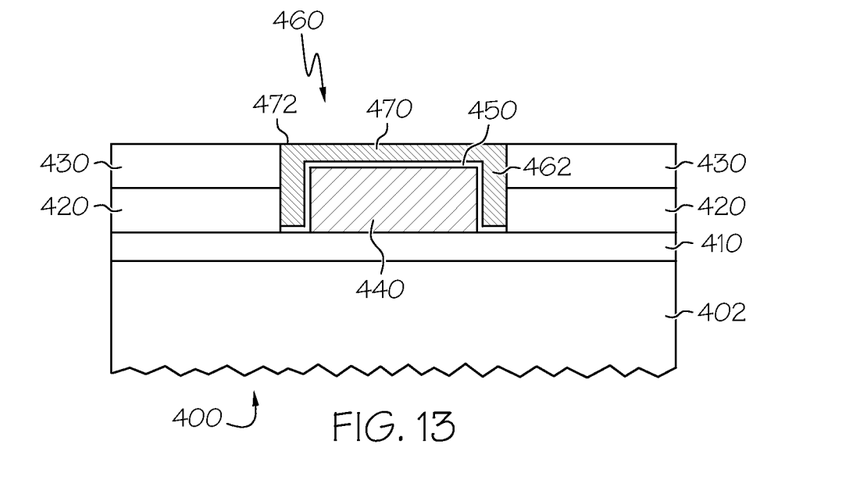

After the deposition of electrically-conductive material 530, excess material can be removed from the interconnect structure 400 (see FIG. 13). More specifically, the overburden portions of resilient material 501, adhesion layer 451, and electrically-conductive material 531 can be removed by polishing the overburdens 501, 531 off the oxide layer 430. In this regard, the overburden portions can be removed by chemical mechanical polishing/planarizing (CMP), using the oxide layer 430 as a stop layer, stop marker, terminating layer or endpoint measure. After the CMP process, the remaining electrically-conductive material 530 includes the perimeter portion 462 and capping portion 470, collectively forming the electrically-conductive platform 460. The electrically-conductive platform 460 has an upper surface 472. Preferably, the electrically-conductive platform 460 has a height matching the level of the surrounding nitride 420 and oxide 430 layers.

Figure 14:
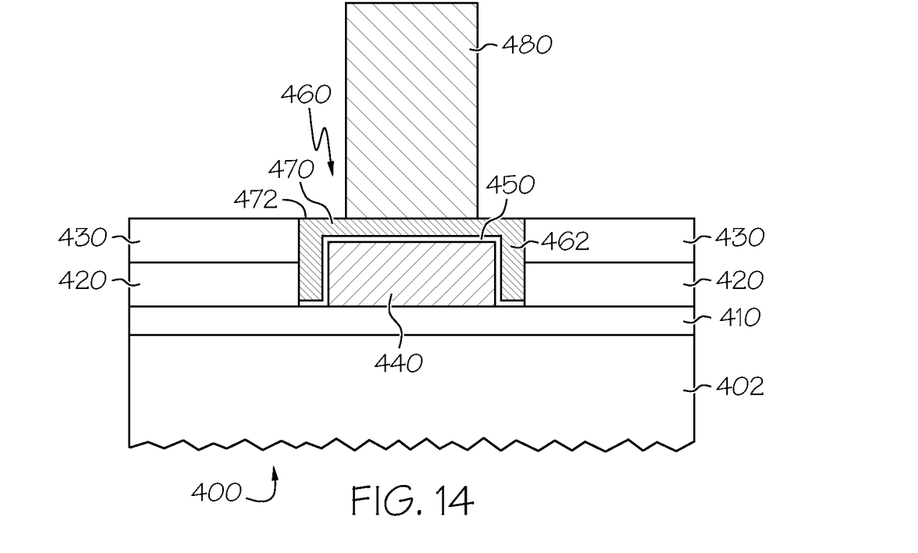

As shown in FIG. 14, after the removal process, an electrically-conductive pillar interconnect 480 atop the electrically-conductive platform 460 can be formed. The pillar interconnect 480 is preferably positioned on the upper surface 472 of the capping portion 470. The pillar interconnect 480 can be formed in any suitable manner, including a combination of known deposition and selective removal techniques. The pillar interconnect 480 can be fabricated in accordance with conventional device manufacturing and semiconductor packaging techniques, and such conventional techniques will not be described in detail here. Preferably, the pillar interconnect 480 is coupled to the electrically-conductive platform 460. Additionally, as shown, preferably the pillar interconnect 480 overlays the resilient block 440, and does not extend to overlay the perimeter portion 462.

Figure 15:
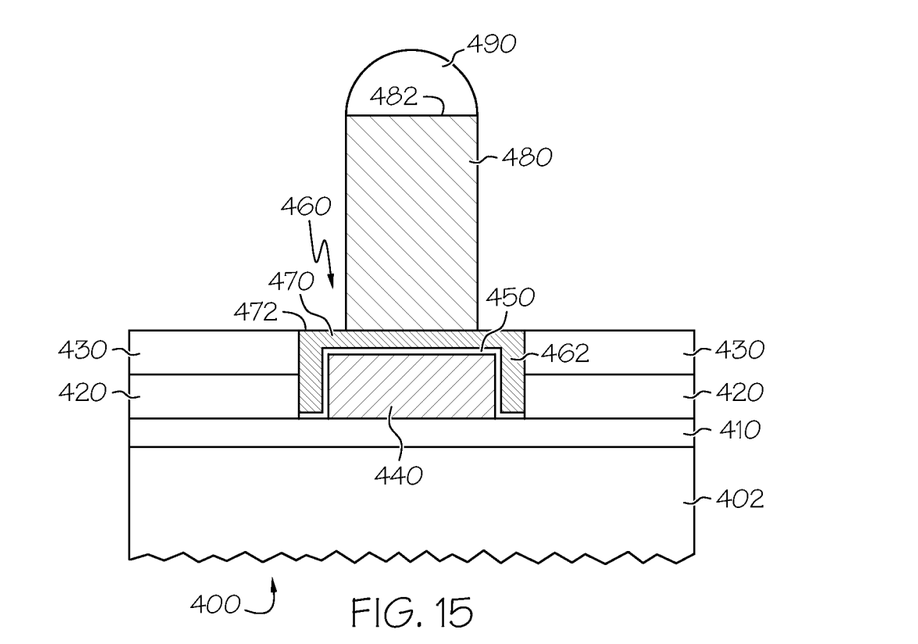
FIG. 15 is a cross sectional view of the interconnect structure, after formation of the resilient stress absorber.

As shown in FIG. 15, after the pillar interconnect has been created, a solder bead 490 can be formed atop the pillar interconnect 480. The solder bead 490 can be formed using any desired technique to position it on the termination end 482 of the pillar interconnect 480. The solder bead 490 can be subjected to a variety of techniques to shape it, including a reflow process, to aid connectivity with external components and/or circuitry. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of forming a contact platform for a device substrate, the method comprising:
    providing a semiconductor device structure having an electrically-conductive contact element, a passivation layer atop the electrically-conductive contact element, and a recess extending through the passivation layer and terminating at the electrically-conductive contact element;
    at least partially filling the recess with a resilient material;
    selectively removing a portion of the resilient material to form a resilient pad, the resilient pad overlying the electrically-conductive contact element and spaced apart from the passivation layer;
    forming an electrically-conductive platform such that the electrically-conductive platform at least partially surrounds the resilient pad; and
    after forming the electrically-conductive platform, removing excess resilient material from the semiconductor device structure, the excess resilient material overlying the passivation layer, wherein the step of removing excess material comprises polishing the semiconductor device structure using the passivation layer as a stop layer.

2. A method of forming a contact platform for a device substrate, the method comprising:
    providing a semiconductor device structure having an electrically-conductive contact element, a passivation layer atop the electrically-conductive contact element, and a recess extending through the passivation layer and terminating at the electrically-conductive contact element;
    at least partially filling the recess with a resilient material;
    selectively removing a portion of the resilient material to form a resilient pad, the resilient pad overlying the electrically-conductive contact element and spaced apart from the passivation layer;
    forming an electrically-conductive platform such that the electrically-conductive platform at least partially surrounds the resilient pad; and
    forming an electrically-conductive pillar interconnect overlying and electrically coupled to the electrically-conductive platform, the electrically-conductive pillar interconnect having an outer perimeter, the outer perimeter entirely overlying the resilient pad.

3. The method of claim 2, further comprising forming a solder bead atop the electrically-conductive pillar interconnect.

4. The method of claim 1, wherein the step of at least partially filling the recess comprises depositing a polyimide material on the semiconductor device structure, the polyimide material at least partially overlying the passivation layer.

5. A method of forming a contact platform for a semiconductor device structure having an electrically-conductive contact element and insulating material overlying the electrically-conductive contact element, the method comprising:
    forming a recess extending through the insulating material and terminating at the electrically-conductive contact element;
    forming a resilient pad in the recess, the resilient pad overlying the electrically-conductive contact element, the resilient pad having a height less than the height of the insulating material, and the resilient pad formed with space between sidewalls of the resilient pad and sidewalls of the insulating material;
    forming an electrically-conductive platform overlying the resilient pad and electrically coupled to the electrically-conductive contact element; and
    forming an electrically-conductive pillar interconnect overlying and electrically coupled to the electrically-conductive platform.

6. The method of claim 5, wherein forming the electrically-conductive platform comprises depositing an electrically-conductive material overlying the resilient pad such that the electrically-conductive material fills the space between the sidewalls of the resilient pad and the sidewalls of the insulating material.

7. The method of claim 5, wherein forming the electrically-conductive platform comprises at least partially surrounding the resilient pad with electrically-conductive material.

8. The method of claim 5, wherein forming the electrically-conductive pillar interconnect is performed such that the electrically-conductive pillar interconnect has an outer perimeter entirely overlying the resilient pad.

9. The method of claim 5, further comprising forming a solder bead atop the electrically-conductive pillar interconnect.

10. A method of forming a contact platform for a semiconductor device structure having an electrically-conductive contact element and insulating material overlying the electrically-conductive contact element, the method comprising:

forming a recess extending through the insulating material and terminating at the electrically-conductive contact element;

forming a resilient pad in the recess with space between sidewalls of the resilient pad and sidewalls of the insulating material, the resilient pad overlying the electrically-conductive contact element;

forming an adhesion layer overlying and surrounding the resilient pad, and overlying a portion of the electrically-conductive contact element; and forming an electrically-conductive platform overlying the adhesion layer.

11. The method of claim 10, wherein forming the electrically-conductive platform electrically couples the electrically-conductive contact element to the electrically-conductive platform, via the adhesion layer.

12. The method of claim 10, further comprising forming an electrically-conductive pillar interconnect overlying and electrically coupled to the electrically-conductive platform.

13. The method of claim 12, wherein forming the electrically-conductive pillar interconnect is performed such that the electrically-conductive pillar interconnect has an outer perimeter entirely overlying the resilient pad.

14. The method of claim 12, further comprising forming a solder bead atop the electrically-conductive pillar interconnect.

15. The method of claim 10, wherein forming the electrically-conductive platform comprises depositing an electrically-conductive material overlying the adhesion layer such that the electrically-conductive material fills space between the adhesion layer and sidewalls of the insulating material.

16. The method of claim 10, wherein forming the electrically-conductive platform comprises at least partially surrounding the resilient pad with electrically-conductive material.

* * * * *